(12) United States Patent
Kellar et al.

(10) Patent No.: US 6,887,769 B2
(45) Date of Patent: May 3, 2005

(54) DIELECTRIC RECESS FOR WAFER-TO-WAFER AND DIE-TO-DIE METAL BONDING AND METHOD OF FABRICATING THE SAME

(75) Inventors: Scot A. Kellar, Bend, OR (US); Sarah E. Kim, Portland, OR (US); R. Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 10/066,645

(22) Filed: Feb. 6, 2002

(65) Prior Publication Data

US 2003/0157782 A1 Aug. 21, 2003

(51) Int. Cl.$^7$ .................. H01L 21/30; H01L 21/46; H01L 21/302; H01L 21/461
(52) U.S. Cl. .................. 438/455; 438/459; 438/692
(58) Field of Search .................. 438/455, 459, 438/692

(56) References Cited

U.S. PATENT DOCUMENTS

| | | |
|---|---|---|
| 4,607,779 A | 8/1986 | Burns |
| 4,689,113 A | 8/1987 | Balasubramanyam et al. |
| 5,241,450 A | 8/1993 | Bernhardt et al. |
| 5,366,908 A | 11/1994 | Wojnarowski et al. |
| 5,401,672 A | 3/1995 | Kurtz et al. |
| 5,419,806 A | 5/1995 | Huebner |
| 5,455,445 A | 10/1995 | Kurtz et al. |
| 5,473,197 A | 12/1995 | Idaka et al. |
| 5,627,106 A | 6/1997 | Hsu |
| 5,656,554 A * | 8/1997 | Desai et al. .................. 438/691 |
| 5,773,986 A | 6/1998 | Thompson et al. |
| 5,545,281 A | 8/1998 | Matsui et al. |
| 5,886,635 A | 3/1999 | Budnaitis |
| 6,880,010 | 3/1999 | Davidson |

(Continued)

FOREIGN PATENT DOCUMENTS

EP 0293459 B1 7/1992

OTHER PUBLICATIONS

"Ultra Thin Electronics for Space Applications", 2001 Electronic Components and Technology Conference, 2001 IEEE.
"Copper Wafer Bonding"; A. Fan, A. Rahman, and R. Rief; Electrochemical and Solid–State Letters, 2 (10) 534–536 (1999).
"Face to Face Wafer Bonding for 3D Chip Stack Fabrication to Shorten Wire Lengths", Jun. 27–29, 2000 VMIC Conference 2000 IMIC—200/00/0090(c).
"InterChip Via Technology for Vertical System Integration", Fraunhofer Institute for Reliability and Microintegration, Munich, Germany; Infineon Technologies AG, Munich, Germany; 2001 IEEE.

*Primary Examiner*—Craig A. Thompson
*Assistant Examiner*—Nema Berezny
(74) *Attorney, Agent, or Firm*—Jay P. Beale

(57) ABSTRACT

A three-dimensional (3-D) integrated chip system is provided with a first wafer including one or more integrated circuit (IC) devices; a second wafer including one or more integrated circuit (IC) devices; and metallic lines deposited on opposing surfaces of the first and second wafers at designated locations with an interlevel dielectric (ILD) recess surrounding the metallic lines to facilitate direct metal bonding between the first and second wafers and establish electrical connections between active IC devices on the first and second wafers.

5 Claims, 3 Drawing Sheets

U.S. PATENT DOCUMENTS

| | | |
|---|---|---|
| 5,998,808 A | 12/1999 | Matsushita |
| 6,100,181 A | 8/2000 | You et al. |
| 6,238,951 B1 | 5/2001 | Caillat |
| 6,255,726 B1 | 7/2001 | Vindasius et al. |
| 6,297,072 B1 | 10/2001 | Tilmans et al. |
| 6,340,608 B1 | 1/2002 | Chooi et al. |
| 6,355,501 B1 | 3/2002 | Fung et al. |
| 6,355,976 B1 | 3/2002 | Faris |
| 6,373,130 B1 | 4/2002 | Salaville |
| 6,461,890 B1 | 10/2002 | Shibata |
| 6,468,098 B1 | 10/2002 | Eldridge |
| 8,485,924 | 12/2002 | Kodama et al. |
| 6,504,253 B2 | 1/2003 | Mastromatteo et al. |
| 6,583,512 B2 | 6/2003 | Nakaoka et al. |
| 6,643,920 B2 | 11/2003 | Hori |
| 6,661,085 B2 | 12/2003 | Kellar et al. |
| 6,724,084 B1 | 4/2004 | Hikita et al. |
| 6,762,076 B2 | 7/2004 | Kim et al. |
| 2002/0024628 A1 | 2/2002 | Walker et al. |
| 2002/0163072 A1 * | 11/2002 | Guptal et al. ............... 257/698 |
| 2003/0003703 A1 * | 1/2003 | Barth et al. ................. 438/601 |
| 2003/0053081 A1 * | 3/2003 | Forouhi et al. ............. 356/630 |
| 2003/0079836 A1 | 5/2003 | Lin et al. |
| 2003/0079838 A1 | 5/2003 | Lin et al. |
| 2003/0148598 A1 | 8/2003 | Kellar et al. |
| 2003/0157782 A1 | 8/2003 | Kellar et al. |
| 2004/0014308 A1 | 1/2004 | Kellar et al. |
| 2004/0142540 A1 | 7/2004 | Kellar et al. |

* cited by examiner

DIELECTRIC RECESS FOR WAFER-TO-WAFER AND DIE-TO-DIE METAL BONDING AND METHOD OF FABRICATING THE SAME

TECHNICAL FIELD

This application is related to the following patents and pending patent applications, which are assigned to the assignee of this application: U.S. Pat. No. 6,661,085, filed on Feb. 6, 2002 and issued on Dec. 9, 2003; U.S. patent application Ser. No. 10/066,643, filed on Feb. 6, 2002; U.S. Pat. No. 6,762,076, filed on Feb. 20, 2002 and issued on Jul. 13, 2004; U.S. patent application Ser. No. 10/613,006, filed on Jul. 7, 2003; U.S. patent application Ser. No. 10/695,328, filed on Oct. 27, 2003; and U.S. patent application Ser. No. 10/855,032, filed on May 26, 2004.

The present invention relates to a semiconductor process and, more specifically, relates to a process of facilitating direct metal bonding between wafers or between die, via dielectric recess surrounding metal bonding pads in a three-dimensional (3-D) wafer-to-wafer vertical stack.

BACKGROUND

Integrated circuits (ICs) form the basis for many electronic systems. Essentially, an integrated circuit (IC) includes a vast number of transistors and other circuit elements that are formed on a single semiconductor wafer or chip and are interconnected to implement a desired function. The complexity of these integrated circuits (ICs) requires the use of an ever increasing number of linked transistors and other circuit elements.

Many modern electronic systems are created through the use of a variety of different integrated circuits; each integrated circuit (IC) performing one or more specific functions. For example, computer systems include at least one microprocessor and a number of memory chips. Conventionally, each of these integrated circuits (ICs) is formed on a separate chip, packaged independently and interconnected on, for example, a printed circuit board (PCB).

As integrated circuit (IC) technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, one on top of the other in an arrangement commonly referred to as chip-on-chip structure. Subsequently, multi-chip module (MCM) technology has been utilized to stack a number of chips on a common substrate to reduce the overall size and weight of the package, which directly translates into reduced system size.

Existing multi-chip module (MCM) technology is known to provide performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, MCM approaches still suffer from additional problems, such as bulky package, wire length and wire bonding that gives rise to stray inductances that interfere with the operation of the system module.

An advanced three-dimensional (3D) wafer-to-wafer vertical stack technology has been recently proposed by researchers to realize the ideal high-performance "system on a chip". In contrast to the existing multi-chip module (MCM) technology which seeks to stack multiple chips on a common substrate, 3-D wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

One major challenge of 3-D wafer-to-wafer vertical stack integration technology is the metal bonding between wafers and between die in a single chip. In general, an interlevel dielectric (ILD) layer may be used to bond respective wafers. Isolated metal lines (i.e., metal bonding pads) may be formed at designated bonding areas in the ILD layer to provide electrical interconnections of active IC devices between respective wafers. However, when the metal lines are formed at designated bonding areas in the ILD layer, the metal bonding pads are slightly recessed below the ILD layer which, when pressed together under pressure, will prevent good contact for electrical connection between active device wafers. Therefore, it is desirable to facilitate direct metal bonding between adjacent wafers or between die by selectively recessing the dielectric material surrounding the metal bonding pads and to ensure that adjacent wafers are bonded more firmly and effectively.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of semiconductor wafers and integrated circuit (IC) devices, including, for example, MOS transistors, CMOS devices, MOSFETs, and new memory devices and communication devices such as smart card, cellular phone, electronic tags, gaming devices which may become available as semiconductor technology develops in the future. However, for the sake of simplicity, discussions will concentrate mainly on exemplary use of a dielectric recess for metallic wafer-to-wafer and die-to-die bonding in a three-dimensional (3-D) wafer-to-wafer vertical stack, although the scope of the present invention is not limited thereto.

Figure 1A:
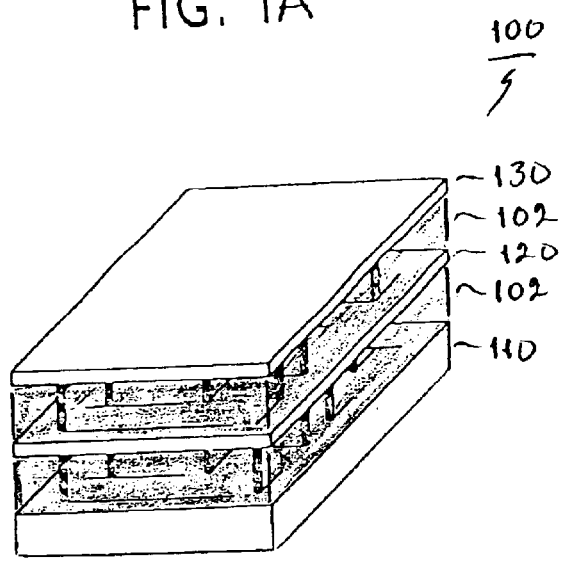
FIGS. 1A–1B illustrate an example three-dimensional (3-D) wafer-to-wafer vertical stack forming a single chip.
Figure 1B:
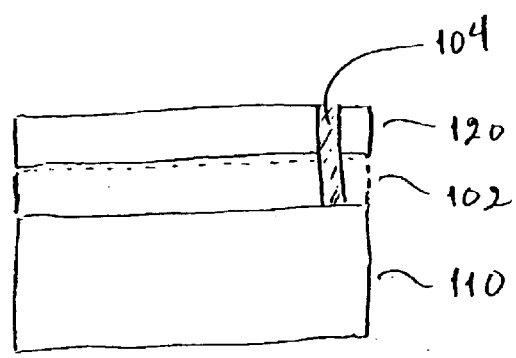

Attention now is directed to the drawings and particularly to FIGS. 1A–1B, an example three-dimensional (3-D) wafer-to-wafer vertical stack according to an embodiment of the present invention is illustrated. As shown in FIG. 1A, the 3-D vertical stack (chip) 100 may comprise any number of active device polysilicon (Si) wafers, such as wafer #1 110 including, for example, one or more microprocessors; wafer #2 120 including one or more memory devices; and wafer #3 130 including one or more radio-frequency (RF) or optical communication devices. The bottom wafer 110 is typically thick to support the stacking of the top wafers 120 and 130, while the top wafers 120 and 130 are thinned to minimize interconnection lengths between wafers 110, 120 and 130.

In a typical 3-D vertical stack 100 shown in FIGS. 1A–1B, the active device wafers 110, 120 and 130 are bonded using an interlevel dielectric (ILD) layer 102, while all active layers on wafers 110, 120 and 130 may be electrically interconnected using vertical vias 104. The dielectric (ILD) layer 102 may be a dielectric glue or a polymer adhesive such as polyimide and epoxy, to bond wafers 110, 120 and 130 at low curing temperature ranging from 150 to 400° C. for example, while maintaining electrical isolation between active IC devices of silicon (Si) wafers 110, 120 and 130. However, other bonding adhesive such as borophosphosilicate glass (BPSG) may also be used to facilitate the wafer bonding process. Interwafer vias 106 may then be etched through the ILD at designated locations, the thinned top Si wafers 120 and 130, and the cured dielectric layer 102 for providing vertical electrical interconnects between active IC devices of the bottom wafer 110 and the top wafers 120 and 130.

Typically, the interwafer vias 104 are prepared on the top wafer 120 as shown in FIG. 1B, for example, by etching through the dielectric (ILD) layer 102. The top wafer 120 is then adhesively bonded to the handling bottom wafer 10 and thinned with high uniformity until the trenches are opened. After the bonding process, the bottom wafer 100 may be removed, leaving the desired wafer stack that can be further processed like a standard silicon (Si) wafer. The interwafer vias 104 are opened to a standard metallization (typically using Aluminum "Al") and passivation.

However, there are still limitations regarding the use of dielectric (ILD) layer 102 and interwafer vias 104 in direct 3-D integration. For example, the interwafer vias 104 between adjacent wafers 110 and 120 are typically deep which lead to some interconnect RC delay in active IC devices. In addition, the dielectric (ILD) layer 102 can also be cost-prohibitive for mass production.

In order to reduce the use of dielectric (ILD) layers 102 between adjacent wafers 110, 120 and 130, and to minimize the interconnect RC delay in active IC devices through the interwafer vias 104, proposals have been made to use metal lines arranged on the surface of adjacent wafers 110, 120 and 130 to serve not only as electrical connections to active IC devices on adjacent wafers 110, 120 and 130 on a 3-D wafer-to-wafer vertical stack 100 but also to bond the adjacent wafers 110, 120 and 130. In addition, dummy metal bumps can be made to increase the surface area for wafer bonding and serve as auxiliary structures such as ground planes or heat conduits for the active IC devices.

Figure 2:
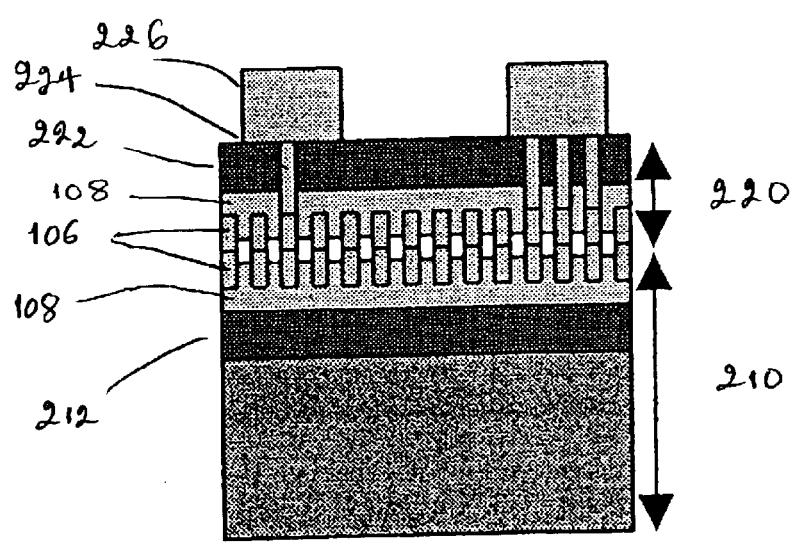
FIG. 2 illustrates an example three-dimensional (3-D) wafer-to-wafer vertical stack according to an embodiment of the present invention.
Figure 3:
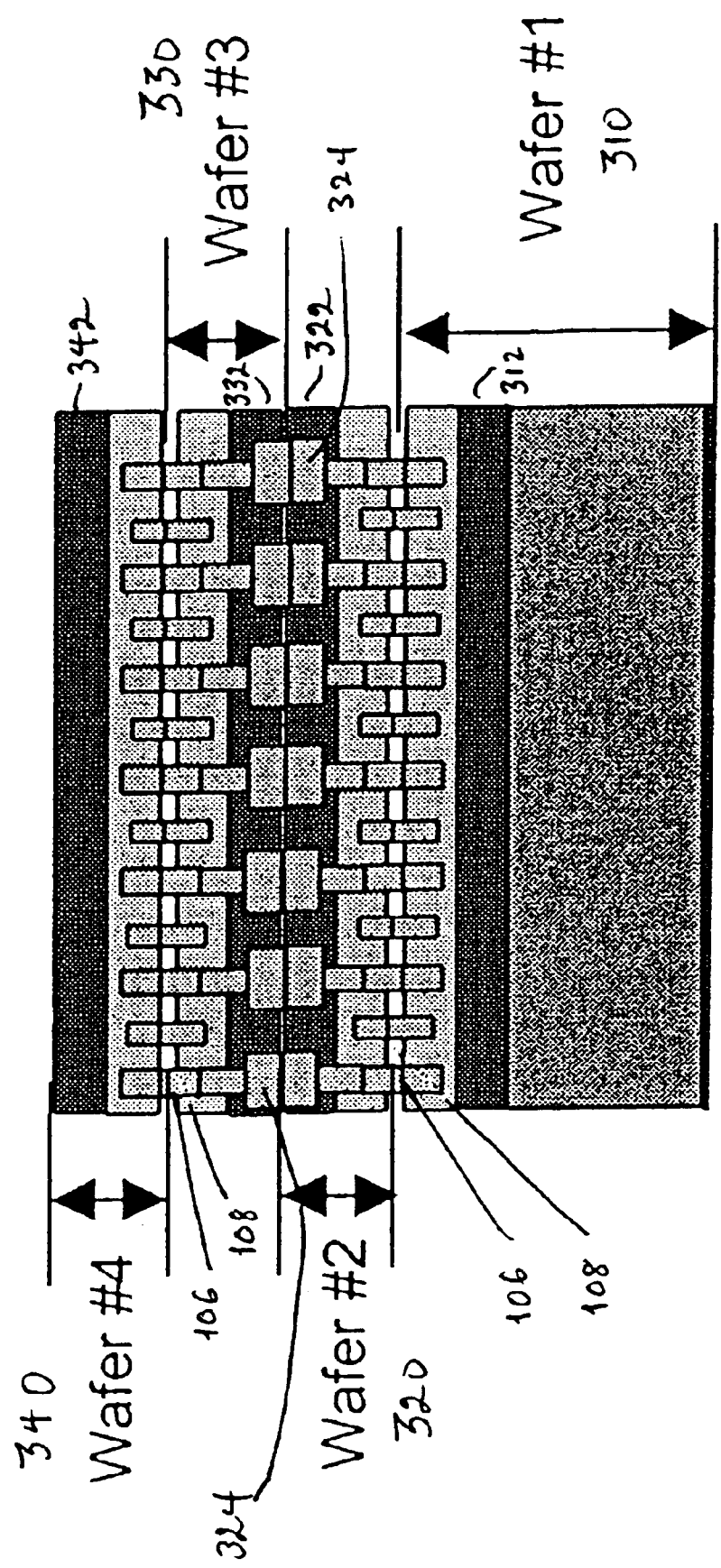
FIG. 3 illustrates another example three-dimensional (3-D) wafer-to-wafer vertical stack according to an embodiment of the present invention.

Turning now to FIGS. 2–3, various example three-dimensional (3-D) wafer-to-wafer vertical stacks according to an embodiment of the present invention are illustrated. Specifically, FIG. 2 illustrates an example 2-wafer vertical stack 200 according to an embodiment of the present invention; and FIG. 3 illustrates an example 4-wafer vertical stack 300 according to an embodiment of the present invention. However, the number of wafers in a vertical stack is not limited thereto. Through 3-D interconnect structure shown in FIGS. 2–3, wiring between vertically stacked wafers can be shortened resulting a faster signal and minimal interconnect RC delays. In addition, the 2-wafer or 4-wafer vertical stack can effectively integrate diverse process technologies on a single wafer process, such as, for example, logic/memory stacking, processor stacking, optical interconnect, system-on-chip, and RF interconnect.

As shown in FIG. 2, the bottom silicon (Si) wafer 210 contains an active device layer 212 supporting one or more active IC devices (not shown). Likewise, the top Si wafer 220 also contains an active device layer 222 supporting one or more active IC devices (not shown). The wafers 210 and 220 may be aligned using a standard alignment tool and bonded, via a metal bonding layer 106 deposited on opposing surfaces of the bottom wafer 210 and the top wafer 220 at designated bonding areas to establish electrical connections between active IC devices on adjacent wafers 210 and 220 and to bond the adjacent wafers 210 and 220, while maintaining electrical isolation between bonding areas via an ILD layer 108. The top wafer 220 can also be thinned by either a Chemical Mechanical Polish (CMP) or Silicon (Si) wet etch process so as to be much more pliable than those of standard thickness and to allow for greater thickness variations across the wafers 210 and 220 for the same applied bonding pressure. After the wafer bonding and silicon (Si) thinning processes are completed, one or more vertical vias 224 may be etched, via the top wafer 220, to establish electrical connections of active IC devices to an external interconnect, via a C4 bump 226.

In the example 2-wafer vertical stack 200 as shown in FIG. 2, the metal bonding process between adjacent wafers 210 and 220 may be performed in a vacuum, or an inert gas environment. The metal bonding layer 106 may include a plurality of Copper (Cu) lines on opposing surfaces of both wafers 210 and 220 that can serve as electrical contacts between active IC devices on both wafers 210 and 220. Copper (Cu) may be selected because of its low electrical resistivity and high electromigration resistance. In addition, copper (Cu) can be readily used for metal diffusion bonding in contrast with the commonly used Aluminum (Al). However, other metallic materials can also be used, including, for example, gold, nickel, silver, palladium, palladium-nickel alloy, titanium, or any combination thereof In an example 4-wafer vertical stack 300 shown in FIG. 3, each of the silicon (Si) wafers 310, 320, 330 and 340 contains a respective active device layer 312, 322, 332 and 342 supporting one or more active IC devices (not shown). Wafer #1 310 and wafer #2 320 may be aligned and bonded via a metal bonding layer 106 deposited on opposing surfaces of the wafers #1 310 and #2 320 at designated bonding areas to establish electrical connections between active IC devices on adjacent wafers 310 and 320 and to bond the adjacent wafers 310 and 320, while maintaining electrical isolation between bonding areas via an ILD layer 108. Wafer #3 330 may then be aligned and bonded on the top surface of wafer #2 320, via vertical vias 324. Wafer #4 340 may be aligned and bonded on the top surface of wafer #3 330, via the same metal bonding layer 106 deposited on opposing surfaces of the wafers #3 330 and #4 340 at designated bonding areas to establish electrical connections between active IC devices on adjacent wafers 330 and 340 and to concurrently bond the adjacent wafers 330 and 340, while maintaining electrical isolation between bonding areas via an ILD layer 108.

Figure 4:
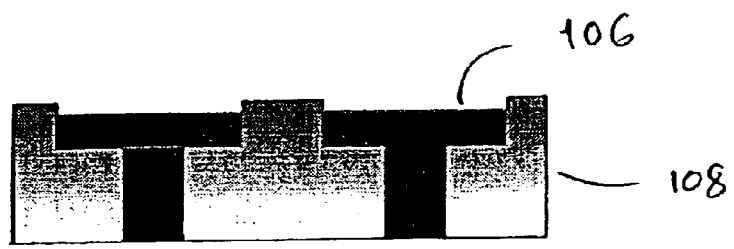
FIG. 4 illustrates an example metal line formation in an interlevel dielectric (ILD) layer of a respective wafer.

As shown in FIG. 4, the metal bonding layer 106 may be deposited on opposing surfaces of active device wafers (210 and 220 shown in FIG. 2, or 310, 320, 330 and 340 shown in FIG. 3) after the ILD layer 108 is etched at designated bonding areas. The metal bonding layer 108 may then be planarized by Chemical Mechanical Polish (CMP) or grinding until metal bonding pads are exposed for electrical connections between active IC devices on adjacent wafers (210 and 220 shown in FIG. 2, or 310, 320, 330 and 340 shown in FIG. 3). However, when the metallic lines are formed at designated bonding areas in the ILD layer 108 of adjacent wafers (210 and 220 shown in FIG. 2, or 310, 320, 330 and 340 shown in FIG. 3), the metal bonding pads 106 are left recessed below the ILD layer 108 which will prevent good contact, if not any contact at all, for electrical connections between active device wafers.

Figure 5:
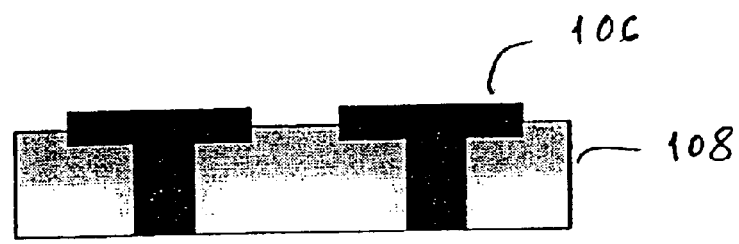
FIG. 5 illustrates an example metal line formation in an interlevel dielectric (ILD) layer of a respective wafer according to an embodiment of the present invention.

FIG. 5 illustrates an example metal line formation in the ILD layer 106 of opposing surfaces of adjacent wafers (210 and 220 shown in FIG. 2, or 310, 320, 330 and 340 shown in FIG. 3) according to an embodiment of the present invention. As shown in FIG. 5, the ILD layer 108 surrounding the metal bonding pads 106 can be made at a lower level than the metal bonding pads 106 to allow the metal bonding pads 106 to rise above the ILD layer 108 on the surface of the bottom wafer and make direct contact with the metal bonding pads 106 on the surface of the top wafer. A dielectric recess surrounding the metal bonding pads 106 can be created to facilitate direct metal bonding between adjacent wafers or between die to ensure that adjacent wafers (210 and 220 shown in FIG. 2, or 310, 320, 330 and 340 shown in FIG. 3) are bonded more firmly and effectively, while maintaining electrical isolation between bonding areas.

The dielectric recess can be created in several ways, including CMP, selective etch, or other process that leaves the metal bonding pads higher than the dielectric for metallic wafer-to-wafer and die-to-die bonding, while maintaining electrical isolation between bonding areas. For example, when the metal bonding layer 108 is planarized by Chemical Mechanical Polish (CMP) to form metal bonding pads, the chemical component can be changed to attack the ILD layer 106 instead of the metal bonding layer 108, thereby allowing the metal bonding pads 106 to rise above the ILD layer 108. Alternatively, the dielectric recess can also be created by selectively (chemical) etching surrounding areas of the metal bonding pads 106.

After the dielectric recess, height variations in the copper metal bonding layer 106 across the adjacent wafers (210 and 220 shown in FIG. 2, or 310, 320, 330 and 340 shown in FIG. 3) may cause some bonding pads to be higher than others. As a result, some elastic or plastic deformation of either the copper (Cu) metal bonding layer 106, the adjacent wafers (210 and 220 shown in FIG. 2, or 310, 320, 330 and 340 shown in FIG. 3), or the ILD dielectric 108 may be desirable to ensure that the adjacent wafers (210 and 220 shown in FIG. 2, or 310, 320, 330 and 340 shown in FIG. 3) are bonded more uniformly. For example, if the copper (Cu) metal bonding layer 106 is not pliable enough or the variability of the dielectric recess process is too great lo allow for more bonding pads to make direct contact, the use of a more pliable, self-leveling dielectric material may advantageously allow for better contact between the adjacent wafers (210 and 220 shown in FIG. 2, or 310, 320, 330 and 340 shown in FIG. 3) during the bonding process. Specifically, a high-temperature deformable dielectric such as SILK may be used as the ILD layer 108 to allow the bonding areas to be self-leveling to account for height variations across the wafers to be bonded. The plastically deformable dielectric can facilitate a higher density more manufacturable and lower cost process. This is because SILK experiences a glass transition near 450° C. while copper (Cu) has a bonding temperature of about 400° C.

Figure 6:
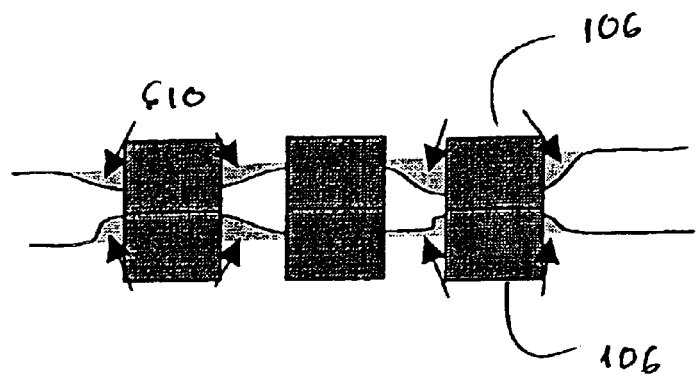
FIG. 6 illustrates an example dielectric plastic deformation at high temperature to facilitate the metal bonding process according to an embodiment of the present invention.

For example, FIG. 6 illustrates an example dielectric plastic deformation at high temperature to facilitate the metal bonding process according to an embodiment of the present invention. When the copper (Cu) metal bonding pads of opposing surfaces of adjacent wafers are being bonded, SILK 610 will plastically deformed at the high temperature needed for the metal bonding to produce a more planar interface and facilitate bonding between high and low points on opposing surfaces of adjacent wafers in order to ensure that adjacent wafers are bonded more firmly and effectively, while maintaining electrical isolation between bonding areas.

As described in this invention, the dielectric recess surrounding the metal bonding pads for wafer-to-wafer and die-to-die bonding according to an embodiment of the present invention can effectively produce greater contact surface area across adjacent wafers even with some height variations in the bonding areas.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A three-dimensional (3-D) integrated chip system, comprising:

a first wafer including one or more integrated circuit (IC) devices, a first plurality of metallic bonding pads deposited via an interlevel dielectric (ILD) for wafer-to-wafer bonding and electrical interconnection, the first plurality of metallic bonding pads having a variety of heights, and an ILD recess surrounding the first plurality of metallic bonding pads deposited via the ILD; and a second wafer including one or more integrated circuit (IC) devices, a second plurality of metallic bonding pads deposited via an interlevel dielectric (ILD) for wafer-to-wafer bonding and electrical interconnection, the second plurality of metallic bonding pads having a variety of heights, and an ILD recess surrounding the second plurality of metallic bonding pads deposited via the ILD, wherein the first plurality of metallic bonding pads is bonded to the second plurality of metallic bonding pads to establish electrical connections between active IC devices on the adjacent wafers, wherein the ILD is a high-temperature deformable dielectric used to allow the bonding areas to be self-leveling to facilitate the bonding of wafers having bonding pads of a variety of heights, wherein the high-temperature deformable dielectric is SILK which exhibits a glass transition near 450° C. while the metallic bonding pads exhibit a bonding temperature of about 400° C., and wherein the ILD recesses are created by a Chemical Mechanical Polish (CMP) or by selectively etching the ILD surrounding the metallic bonding pads deposited via the ILD.

2. The three-dimensional (3-D) integrated chip system as claimed in claim 1, wherein the matallic bonding pads include Copper (Cu) bonding pads on opposing surface of the adjacent wafers to serve as electrical contacts between active IC devices on both the adjacent wafers.

3. A three-dimensional (3-D) integrated chip system, comprising:

a first wafer including one or more integrated circuit (IC) devices;

a second wafer including one or more integrated circuit (IC) devices; and metallic lines deposited on opposing surfaces of the first and second wafers at designated locations with an interlevel dielectric (ILD) recess, created by a chemical mechanical polish or by selectively etching the ILD surrounding the metallic lines, surrounding the metallic lines to facilitate direct metal bonding between the first and second wafers and establish electrical connections between active IC devices on the first and second wafers, wherein the ILD is a high-temperature deformable dielectric used to allow the bonding areas to be self-leveling to account for height variations across the adjacent wafers to be bonded, wherein the high-temperature deformable dielectric is SILK which exhibits a glass transition near 450° C. while the metallic lines exhibit a bonding temperature of about 400° C.

4. The three-dimensional (3-D) integrated chip system as claimed in claim 3, wherein the metallic lines include a plurality of Copper (Cu) bonding pads on opposing surface of the adjacent wafers to serve as electrical contacts between active IC devices on both the adjacent wafers.

5. The three-dimensional (3-D) integrated chip system as claimed in claim 3, wherein the first wafer is thinner than the second wafer to conform to height differences of the metallic lines across opposing surfaces of the adjacent wafers.

* * * * *